US011119698B2

(12) United States Patent
Jung

(10) Patent No.: US 11,119,698 B2
(45) Date of Patent: Sep. 14, 2021

(54) DATA STORAGE DEVICE CAPABLE OF PARALLEL WRITING, OPERATING METHOD THEREOF, AND STORAGE SYSTEM HAVING THE SAME

(71) Applicant: SK hynix Inc., Gyeonggi-do (KR)

(72) Inventor: Sang Hune Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 121 days.

(21) Appl. No.: 16/528,000

(22) Filed: Jul. 31, 2019

(65) Prior Publication Data
US 2020/0174701 A1 Jun. 4, 2020

(30) Foreign Application Priority Data

Dec. 3, 2018 (KR) .................. 10-2018-0153901

(51) Int. Cl.
*G06F 3/06* (2006.01)
*G11C 11/56* (2006.01)
*G06F 12/02* (2006.01)

(52) U.S. Cl.
CPC .......... *G06F 3/0659* (2013.01); *G06F 3/0604* (2013.01); *G06F 3/068* (2013.01); *G06F 3/0644* (2013.01); *G06F 3/0656* (2013.01); *G06F 3/0679* (2013.01); *G06F 12/0246* (2013.01); *G11C 11/5628* (2013.01); *G06F 2212/7203* (2013.01); *G11C 2211/5642* (2013.01); *G11C 2211/5643* (2013.01)

(58) Field of Classification Search
None
See application file for complete search history.

(56) References Cited

U.S. PATENT DOCUMENTS

| | | | | |
|---|---|---|---|---|
| 5,930,167 A * | 7/1999 | Lee | ..................... | G06F 12/0246 365/185.03 |
| 2010/0172179 A1* | 7/2010 | Gorobets | ............ | G06F 12/0866 365/185.09 |
| 2010/0172180 A1* | 7/2010 | Paley | .................. | G06F 12/0246 365/185.12 |
| 2011/0153912 A1* | 6/2011 | Gorobets | ............ | G11C 11/5628 711/103 |
| 2011/0296122 A1* | 12/2011 | Wu | ..................... | G06F 12/0804 711/156 |

(Continued)

FOREIGN PATENT DOCUMENTS

KR 1020170075855 7/2017

*Primary Examiner* — Nathan Sadler
(74) *Attorney, Agent, or Firm* — IP & T Group LLP

(57) ABSTRACT

A data storage device includes a storage including a first and a second memory region, a buffer memory, and a controller. The controller includes a prewrite component configured to write first chunk data, which is configured of a group of a plurality of pieces of unit data and is at least one of first type chunk data, in the first memory region from the buffer memory, a combination unit configured to, as second chunk data which is new first type chunk data is introduced into the buffer memory, generate at least one second type chunk data by combining at least one of the plurality of pieces of unit data constituting the first chunk data and at least one of a plurality of pieces of unit data constituting the second chunk data, and a main write component configured to write the second type chunk data in the second memory region.

19 Claims, 8 Drawing Sheets

(56) References Cited

U.S. PATENT DOCUMENTS

| | | | |
|---|---|---|---|
| 2014/0104955 A1* | 4/2014 | Kwak | G11C 29/028 365/185.19 |
| 2014/0181377 A1* | 6/2014 | Kimmel | G06F 12/12 711/103 |
| 2018/0341406 A1* | 11/2018 | Sankule | G06F 3/061 |

* cited by examiner

| Die0 | D01 | D05 | D09 | ← 1: second type chunk data 1 |
| Die1 | D03 | D07 | D11 | ← 2: second type chunk data 2 |
| Die2 | D02 | D06 | D10 | ← 3: second type chunk data 3 |
| Die3 | D04 | D08 | D12 | ← 4: second type chunk data 4 |

| Die0 | (1) | D.O | (5) | D.O | (9) | D.O | | |
| Die1 | | (3) | D.O | (7) | D.O | (11) | D.O | |

| Die2 | (2) | D.O | (6) | D.O | (10) | D.O | | |
| Die3 | | (4) | D.O | (8) | D.O | (12) | D.O | |

DATA STORAGE DEVICE CAPABLE OF PARALLEL WRITING, OPERATING METHOD THEREOF, AND STORAGE SYSTEM HAVING THE SAME

CROSS-REFERENCE TO RELATED APPLICATION

The present application claims priority under 35 U.S.C. § 119(a) to Korean application number 10-2018-0153901, filed on Dec. 3, 2018, in the Korean Intellectual Property Office, which is incorporated herein by reference in its entirety.

BACKGROUND

1. Technical Field

Various embodiments generally relate to a semiconductor integrated device, and more particularly, to a data storage device, an operating method thereof, and a storage system having the same.

2. Related Art

Storage devices may be coupled to a host device and perform a data input/output operation according to a request of the host device. The storage devices may employ various storage media to store data. In particular, to provide various functions based on high quality multimedia data, the use of large-capacity storage media in portable information apparatuses has increased.

Storage media employing flash memories have the advantages of a large amount of capacity, non-volatility, low cost, low power consumption, high data processing rate, and the like. Thus, demand for such storage media has increased.

A flash memory may be implemented with a solid state drive (SDD) type which replaces a hard disc drive (HDD), an embedded type used as a built-in memory, a mobile type, and the like and may be applied to various electronic devices.

With the development of electronic devices, the storage media are required to have higher high capability, higher integration, smaller size, higher performance, and higher speed. In particular, the data processing rate in storage media used for processing large-capacity data may act as a main factor which affects the performance of the storage media.

SUMMARY

In an embodiment of the present disclosure, a data storage device may include: a storage including a first memory region and a second memory region; a buffer memory configured to temporarily store data to be stored in the storage; and a controller configured to control the data to be stored in the storage, wherein the controller includes: a prewrite component configured to write first type chunk data, which is configured of plural pieces of unit data, in the first memory region from the buffer memory; a combination component configured to generate at least one segment of second type chunk data by combining at least one piece of unit data constituting a first segment of the first type chunk data and at least one piece of unit data constituting a second segment of the first type chunk data, in which the second segment of the first type chunk data is introduced into the buffer memory after the first segment of the first type chunk data; and a main write component configured to write the at least one segment of second type chunk data in the second memory region.

In an embodiment of the present disclosure, a data storage device may include: a storage including a nonvolatile buffer and a nonvolatile user data storage region; a volatile buffer configured to temporarily store data to be stored in the storage; and a controller configured to generate second type chunk data by combining unit data of first type chunk data temporarily stored in the nonvolatile buffer and unit data of first type chunk data temporarily stored in the volatile buffer and store the second type chunk data in the nonvolatile user data storage region.

In another embodiment of the present disclosure, an operating method of a data storage device which includes a storage including a first memory region and a second memory region, a buffer memory, and a controller configured to control data to be stored in the storage, the method may include: writing, by the controller, first type chunk data, which is configured of plural pieces of unit data, in the first memory region from the buffer memory; generating, by the controller, at least one segment of second type chunk data by combining at least one piece of unit data constituting a first segment of the first type chunk data and at least one piece of unit data constituting a second segment of the first type chunk data, which is introduced into the buffer memory after the first segment of the first type chunk data; and writing, by the controller, the at least one segment of second type chunk data in the second memory region.

In an embodiment of the present disclosure, a data storage device may include: a memory device including a plurality of dies each including: a first memory region of lower storage capacity cells; and a second memory region of higher storage capacity cells; and a controller that: buffers units of data while controlling the memory device to temporarily store at least one first segment, each including multiple units of data, in the first memory regions in a distributed manner; and controls the memory device to perform a one-shot program operation of storing second segments, each including multiple units of data, in the second memory regions in a distributed manner according to a stripe write scheme; wherein the memory device combines a unit of data of each of the temporarily stored first segments with a unit of data of a current first segment to form each of the second segments, and wherein a number of units of data of one of the first segments is the same as a number of the dies.

These and other features, aspects, and embodiments are described below.

BRIEF DESCRIPTION OF THE DRAWINGS

Aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic and block illustrations of various embodiments, including elements and intermediate structures. As such, the drawings are not intended to convey actual sizes or shapes. In some instances, dimensions may be exaggerated to show certain features more clearly.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

More generally, the disclosed embodiments are provided to enable those skilled in the art to practice the invention, not to limit the scope of the invention. It will be appreciated by those skilled in the art in light of the present disclosure that various modifications may be made to any of the disclosed embodiments. The present invention encompasses all such modifications to the extent that they fall within the scope of the claims and equivalents thereof. Also, throughout the specification, reference to "an embodiment," "another embodiment" or the like is not necessarily to only one embodiment, and different references to any such phrase are not necessarily to the same embodiment(s).

Figure 1:
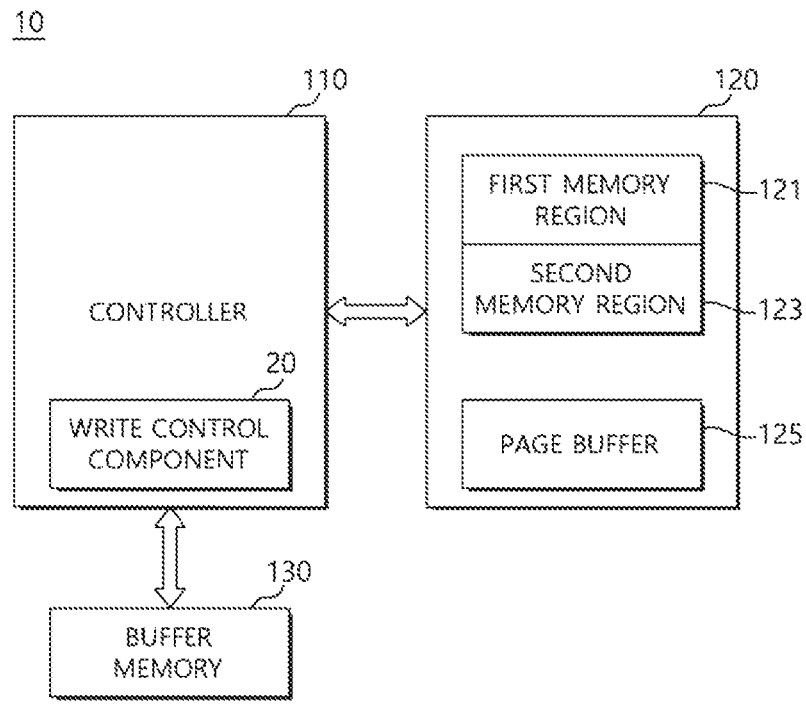
FIG. 1 is a diagram illustrating a configuration of a data storage device according to an embodiment of the present disclosure.

FIG. 1 is a diagram showing a configuration of a data storage device according to an embodiment.

Referring to FIG. 1, a data storage device 10 may include a controller 110, a storage 120, and a buffer memory 130. Although FIG. 1 shows the buffer memory provided external to the controller 110, a buffer memory 130 may also be provided within the controller 110 according to an embodiment.

The controller 110 may control the storage 120 in response to a request of a host device (not shown). For example, the controller 110 may control data to be programmed in the storage 120 according to a program (write) request of the host device. Further, the controller 110 may provide data stored in the storage 120 to the host device in response to a read request of the host device.

The storage 120 may program data or output programmed data according to control of the controller 110. The storage 120 may be configured as a volatile memory device or a nonvolatile memory device. In an embodiment, the storage 120 may be implemented using any of various volatile memory devices, such as a static random access memory (SRAM) and/or a dynamic random access memory (DRAM). In an embodiment, the storage 120 may be implemented using any of various nonvolatile memory devices, such as an electrically erasable and programmable read only memory (EEPROM), a NAND flash memory, a NOR flash memory, a phase-change random access memory (PRAM), a resistive RAM (ReRAM), a ferroelectric RAM (FRAM), and a spin torque transfer magnetic RAM (STT-RAM). The storage 120 may include a plurality of dies, a plurality of chips, or a plurality of packages. Further, each memory cell of the storage 120 may be configured as a single level cell (SLC) in which a single bit of data is stored or a multilevel cell (MLC) in which multiple bits of data is stored.

In an embodiment, the storage 120 may be divided into a first memory region 121 and a second memory region 123. The storage 120 may include a page buffer 125 which is a register or a latch coupled to the memory cells of the storage 120 and which is used in the exchange of data between the memory cells and an external device.

The buffer memory 130 may serve as a space which temporarily stores data when the data storage device 10 performs a series of operations of writing or reading data in conjunction with a host device. The buffer memory 130 may be configured as a volatile memory or a nonvolatile memory. In an embodiment, the buffer memory 130 may include a static random access memory (SRAM) and/or dynamic random access memory (DRAM), but the present invention is not limited thereto. While FIG. 1 illustrates that the buffer memory 130 is arranged externally of the controller 110, in another embodiment the buffer memory 130 may be arranged within the controller 110 and managed through a buffer manager (e.g., buffer manager 117 of FIG. 2).

Due to the limitation of physical storage space of a data storage device mounted on mobile electronic devices such as a smart phone, the storage capacity of the buffer memory 130 may be limited. Accordingly, there is a need to improve write and read performance by overcoming the limited capacity of the buffer memory 130.

The controller 110 may include a write control component 20, which may be configured to perform a write operation on the storage 120 in response to a host command.

Data transmitted and received in the write operation of the write control component 20 may be defined as follows.

TABLE 1

| | |
|---|---|
| Unit data | Data having the same size as one page of first memory region 121<br>A data unit of write/read operation |
| First type chunk data | A group of plural pieces of unit data<br>The number of pieces of the unit data in the first type chunk data is the same as the number of dies in the storage 120 |
| Second type chunk data | A group of unit data to be simultaneously written in the second memory region 123 at one time<br>The number of pieces of unit data in the second type chunk data is the same as the number of data bit(s) stored in a single cell of the second memory region 123 |

In an embodiment, the write control component 20 may temporarily store first type chunk data which is a group of plural pieces of unit data in the buffer memory 130 in response to a write request of a host device. In an embodiment, the unit data may have the same size as one page of the first memory region 121. The first type chunk data may be a set such that the number of pieces of unit data within the first type chunk data is the same as the number of dies included in the storage 120.

The write control component 20 may write at least one piece of the first type chunk data temporarily stored in the buffer memory 130 in the first memory region 121. Then, as new first type chunk data is introduced into the buffer memory 130, the write control component 20 may generate at least one piece of second type chunk data by combining at least one piece of unit data of the current first type chunk data stored in the first memory region 121 and at least one piece of unit data of the new first type chunk data. The generated piece of second type chunk data may be written in the second memory region 123.

In an embodiment, the second type chunk data may be units of data to be simultaneously written in the second memory region 123. For example, when a memory cell in the second memory region 123 stores 3-bit data, the piece of second type chunk data may be generated by a combination of three pieces of unit data.

Accordingly, the buffer memory 130 may be operated as a volatile buffer in which data to be stored in the storage 120 is temporarily stored. The first memory region 121 may serve as a space in which data to be stored in the second memory region 123 is temporarily stored, for example, a nonvolatile buffer. The write control component 20 may be configured to generate the second type chunk data by combining the unit data temporarily stored in the nonvolatile buffer and the unit data temporarily stored in the volatile buffer and store the generated second type chunk data in the nonvolatile memory region.

"Striping" may refer to a type of technology for distributing data of a logical storage space in a physical storage space. For example, the data of the logical storage space may be grouped and written in and read from positions of the physical storage space physically divided through the striping. Striping may allow large sequential files to be read/written with high performance and may also support a random access method.

To perform the write operation using the striping method, the data has to be grouped in stripe write units. Therefore, the data provided from a host device may be first held in a specific temporary storage space such as the buffer memory 130 and then the stripe write operation may be performed when data sufficient to form second type chunk data are collected.

In resource-limited systems, the temporary storage space, where the data is held to be grouped before the striping, may be limited. Accordingly, a portion (for example, the first memory region 121) of the storage 120 may be used as additional buffer space to hold the data for forming the second type chunk data, in addition to the buffer memory 130.

In an embodiment, the unit memory cells constituting the first memory region 121 may be configured to store 1-bit data and may function as the temporary storage space with a high-speed operation.

Since the portion of the storage 120 may be used as additional buffer space when it is difficult to sufficiently store the data for striping in the buffer memory 130, the striping method may be applied even in a resource-limited system environment, such as in mobile electronic devices.

Figure 2:
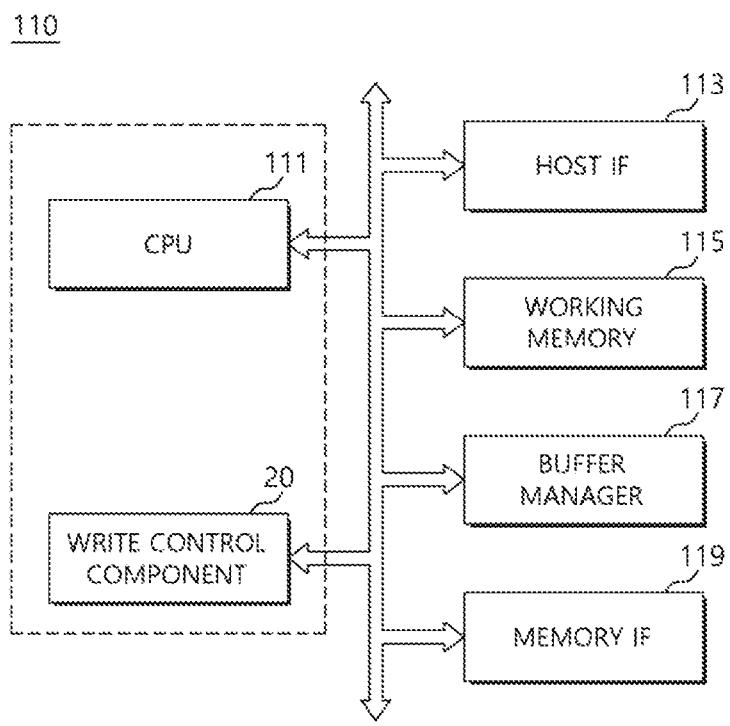
FIG. 2 is a diagram illustrating a configuration of a controller according to an embodiment of the present disclosure.

FIG. 2 is a configuration diagram of a controller, e.g., controller 110, according to an embodiment.

Referring to FIG. 2, the controller 110 according to an embodiment may include a central processing unit (CPU) 111, a host interface (IF) 113, a working memory 115, the buffer manager 117, and a memory interface (IF) 119.

The CPU 111 may be configured to transfer various control information required for a data read or write operation with respect to the storage 120 to the host interface 113, the working memory 115, the buffer manager 117, and the memory interface 119. In an embodiment, the CPU 111 may be operated according to firmware provided for various operations of the data storage device 10. In an embodiment, the CPU 111 may execute a function of a flash translation layer (FTL) which performs garbage collection, address mapping, wear levelling, and the like for managing the storage 120. The CPU 111 may detect and correct an error of data read out from the storage 120 according to the implementation type.

The host interface 113 may receive a command and a clock signal from the host device (e.g., host processor) and provide a communication channel for controlling data input/output, according to control of the CPU 111. In particular, the host interface 113 may provide a physical connection between the host device and the data storage device 10. The host interface 113 may provide interfacing with the data storage device 10 in response to a bus format of the host device. The bus format of the host device may include at least one of various standard interface protocols, such as secure digital, universal serial bus (USB), multi-media card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI Express (PCI-E), and universal flash storage (UFS).

The working memory 115 may store program codes, for example, firmware or software required for an operation of the controller 110 and store code data and the like which are used by the program codes.

The buffer manager 117 may be configured to temporarily store the data, which is transmitted and received between the host device and the storage device 120, in the buffer memory 130 during the program operation or the read operation. The buffer manager 117 may be configured to manage the use state of the buffer memory.

The memory interface 119 may provide a communication channel for transmitting and receiving signals between the controller 110 and the storage 120. The memory interface 119 may write data temporarily stored in the buffer memory 130 in the storage 120 according to control of the CPU 111. The memory interface 119 may transfer data read out from the storage 120 to the buffer memory 130 and temporarily store the data in the buffer memory 130.

The write control component 20 may be configured to support the stripe write function. In an embodiment, the write control component 20 may temporarily store the first type chunk data which is a group of plural pieces of unit data in the buffer memory 130 in response to a write request of the host device. The write control component 20 may write at least one piece of the first type chunk data temporarily stored in the buffer memory 130 in the first memory region 121. Then, as new first type chunk data is introduced into the buffer memory 130, the write control component 20 may generate at least one piece of second type chunk data by combining at least one piece of unit data stored in the first memory region 121 and at least one piece of unit data in the new first type chunk data. The generated second type chunk data may be written in the second memory region 123. Although it is illustrated in FIG. 2 that the write control component 20 is separate from the CPU 111, in another embodiment the write control component 20 may be provided within the CPU 111.

Figure 3:
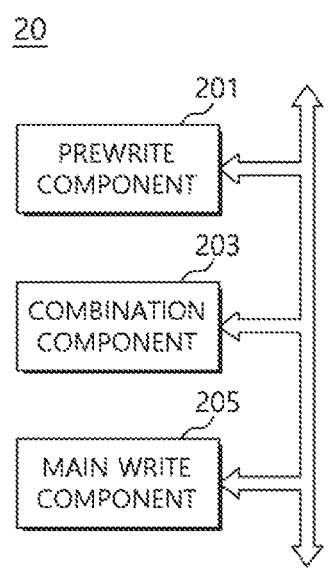
FIG. 3 is a diagram illustrating a configuration of a write control component according to an embodiment of the present disclosure.

FIG. 3 is a configuration diagram of a write control component, e.g., write control component 20, according to an embodiment.

Referring to FIG. 3, the write control component 20 may include a prewrite component 201, a combination component 203, and a main write component 205.

The prewrite component 201 may temporarily store the first type chunk data, which is a group of plural pieces of unit data, in the buffer memory 130 in response to the write request of the host device. The prewrite component 201 may write at least one piece of the first type chunk data temporarily stored in the buffer memory 130 in the first memory region 121.

In an embodiment, the storage 120 may include a plurality of dies, each of which may include the first memory region 121 and the second memory region 123.

The prewrite component 201 of the write control component 20 may distribute and store unit data constituting the first type chunk data temporarily stored in the buffer memory 130 in the first memory regions 121 of the plurality of dies in parallel. In an embodiment, the unit memory cells constituting the first memory region 121 may be set to store 1-bit data.

As new first type chunk data is introduced into the buffer memory 130, the combination component 203 may generate at least one piece of second type chunk data by combining at least one piece of unit data stored in the first memory region 121 and at least one piece of unit data of the new first type chunk data.

In an embodiment, the storage 120 may include first to fourth dies and current first type chunk data may include first to fourth pieces of unit data. The prewrite component 201 may distribute and store the first to fourth pieces of unit data of the current first type chunk data in the first to fourth dies in parallel. Similarly, new first type chunk data, which is introduced into the buffer memory 130 after the current first type chunk data, may include fifth to eighth pieces of unit data, and the prewrite component 201 may distribute and store these fifth to eighth pieces of unit data in the first to fourth dies in parallel.

Subsequent first type chunk data, which is first type chunk data introduced into the buffer memory 130 after the new first type chunk data, may include ninth to twelfth pieces of unit data.

The combination component 203 may generate the second type chunk data by selecting a piece of unit data from each of the current first type chunk data, the new first type chunk data, and the subsequent first type chunk data, respectively. In an embodiment, the combination component 203 may generate: a first segment of second type chunk data by combining the first, fifth, and ninth pieces of unit data, a third segment second type chunk data by combining the second, sixth, and tenth pieces of unit data, a second segment of second type chunk data by combining the third, seventh, and eleventh pieces of unit data, and a fourth segment of second type chunk data by combining the fourth, eighth, and twelfth pieces of unit data.

The main write component 205 may write the segments of second type chunk data generated in the combination component 203 in the second memory region 123.

In an embodiment, a memory cell constituting the second memory region 123 may be set to store 3-bit data. The combination component 203 may generate the second type chunk data in units of data to be simultaneously written in the second memory region 123, for example, in units of data to be simultaneously written in the second memory region 123 through a single one-shot program operation, and the main write component 205 may write the second type chunk data in the second memory region 123 through the one-shot program operation.

The one-shot program may refer to a program operation of storing a plurality of program states of the multi level cell (MLC) through one program cycle. For example, the one-shot program for a 2-bit MLC may refer to a program operation of programming 2-bit data in one memory cell through one program cycle. The one-shot program may be compared with a shadow program method which stores 1-bit data in the MLC during one program cycle.

When the plural pieces of second type chunk data are generated in the combination component 203, the main write component 205 may distribute and store the plural pieces of second type chunk data in the second memory regions 123 of different dies in parallel.

The unit data selected from the first memory region 121 among the second type chunk data may be transferred to the second memory region 123 from the first memory region 121 via the page buffer 125 without involvement of the buffer memory 130.

Accordingly, the portion of the storage space constituting the storage 120 may be used as a temporary storage space for stripe write. Therefore, the temporary storage space in which the data is held to generate the second type chunk data may be sufficiently ensured. When the second type chunk data is generated, the second type chunk data may be written with high speed through the one-shot program method.

FIGS. 4 to 9 are diagrams illustrating a writing method of a data storage device according to an embodiment.

Figure 4:
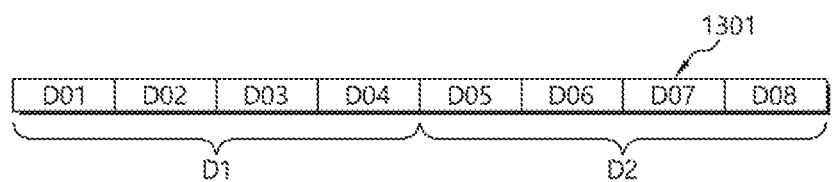
FIGS. 4 to 9 are diagrams illustrating a writing method of a data storage device according to an embodiment of the present disclosure.

As illustrated in FIG. 4, as the plural pieces of first type chunk data are transmitted from a host device, the prewrite component 201 may store the first type chunk data in the buffer memory 1301.

In an embodiment, the first type chunk data may include the first type chunk data D1 including first to fourth pieces of unit data D01 to D04 and the first type chunk data D2 including fifth to eighth pieces of unit data D05 to D08. D1 first type chunk data may be received before D2 first type chunk data. Each of the different first type chunk data, i.e., D1, D2, D3 and D4 may be considered and referred to as a segment.

Figure 5A:
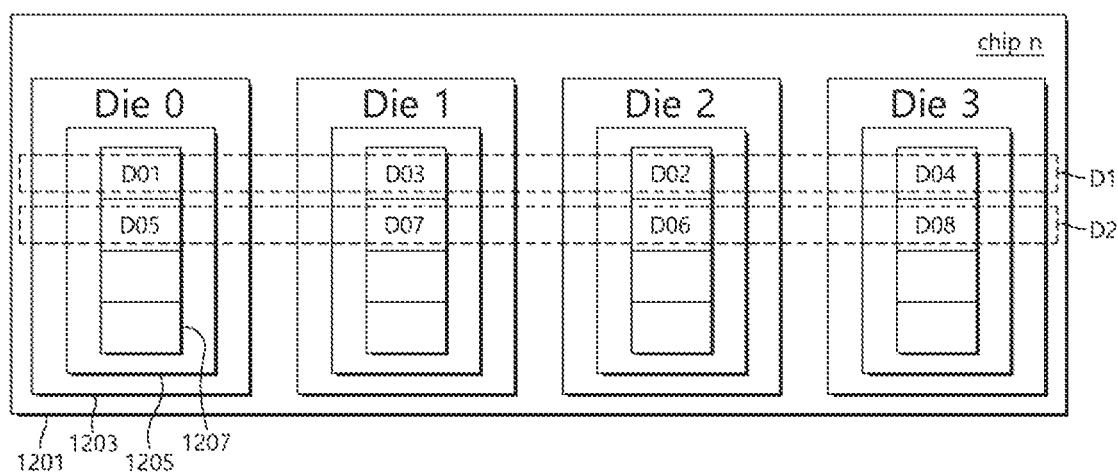

Then, the prewrite component 201 may distribute and store the unit data D01 to D04 and D05 to D08 in the first memory region 121 of the plurality of dies 1201 (Die0 to Die3) in parallel as illustrated in FIG. 5A.

The storage 120 may include at least one chip, the chip may include the plurality of dies (Die0 to Die3), each of which may include at least one plane 1203. The plane 1203 may include at least one block 1205 and the block 1205 may include at least one page 1207. The unit data D01 to D04 of the D1 first type chunk data and the unit data D05 to D08 of the D2 first type chunk data may be distributed and stored in Die0 to Die3.

Figure 5B:
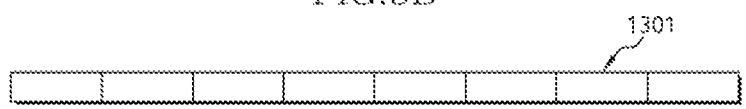

After the D1 first type chunk data and the D2 first type chunk data are written in the first memory region 121, the buffer memory 1301 may be empty as shown in FIG. 5B.

Figure 6:
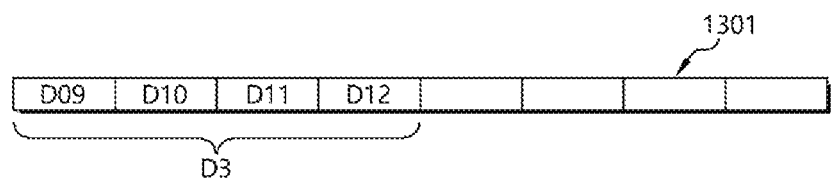

As illustrated in FIG. 6, subsequent first type chunk data D3 may be introduced into the buffer memory 1301. The D3 first type chunk data may include the ninth to twelfth pieces of unit data.

Then, the combination component 203 may generate the second type chunk data by selecting one piece of unit data from each of the D1 first chunk data, the D2 first chunk data, and the D3 first chunk data.

Figure 7:
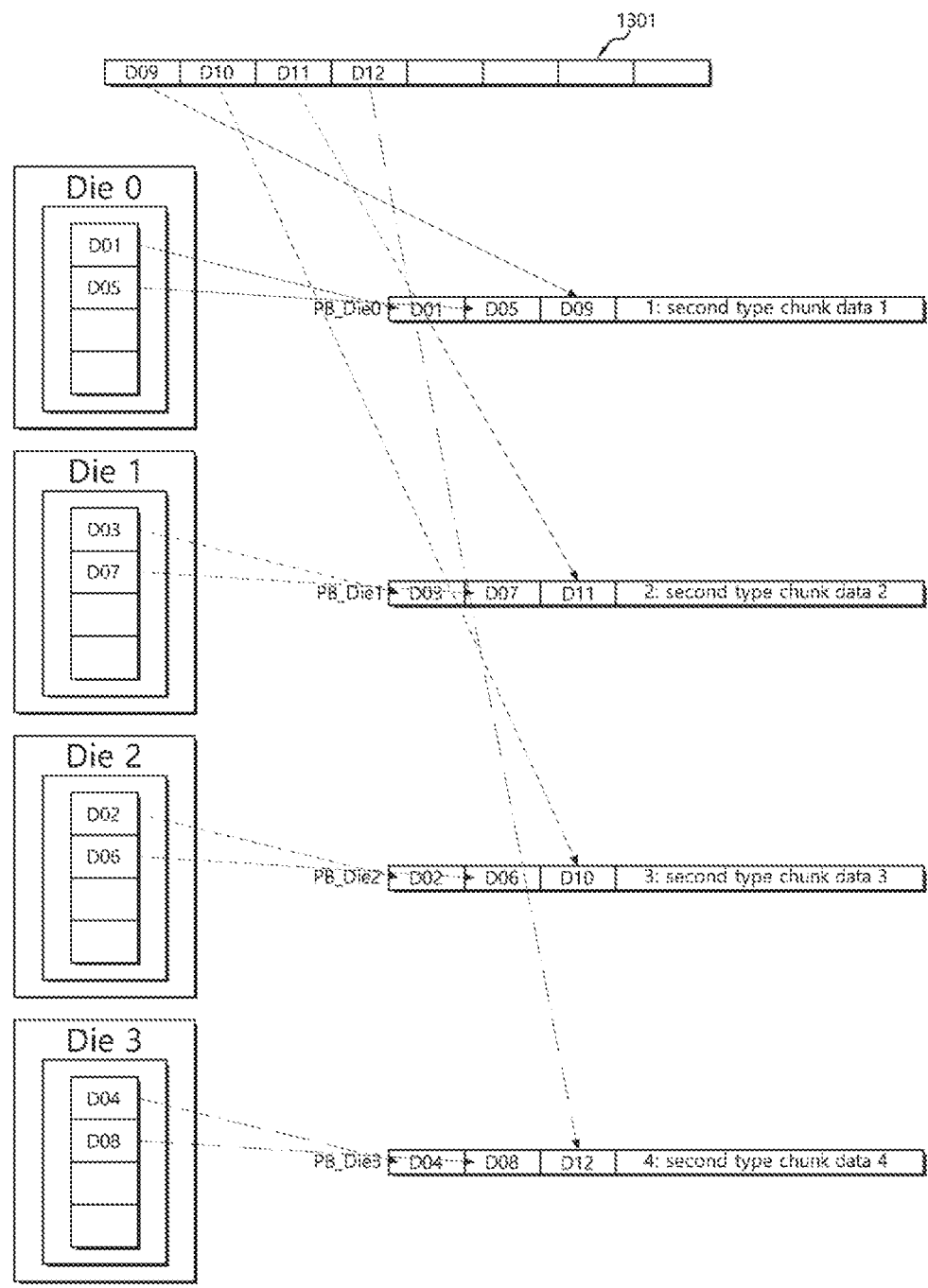

As illustrated in FIG. 7, the combination component 203 may generate second type chunk data 1 by combining the first, fifth, and ninth pieces of unit data, generate second type chunk data 3 by combining the second, sixth, and tenth pieces of unit data, second type chunk data 2 by combining the third, seventh, and eleventh pieces of unit data, and generate second type chunk data 4 by combining the fourth, eighth, and twelfth pieces of unit data.

The main write component 205 may move the second type chunk data segments 1, 2, 3 and 4 to the page buffers 125 of the dies.

Figures 8, 9, 10:
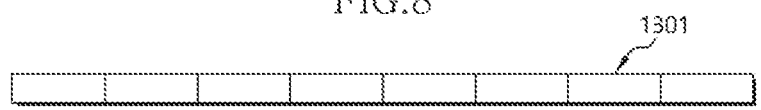
FIG. 10 is a diagram illustrating a reading method of a data storage device according to an embodiment of the present disclosure.

After the segments of second type chunk data are moved to the page buffers 125 of the dies, the D3 first type chunk data D09 to D12 of the buffer memory 1301 may be deleted as illustrated in FIG. 8.

Further, the main write component 205 may write the segments of second type chunk data in the page buffer in the second memory region 123. In an embodiment, the main write component 205 may distribute and write the plural pieces of second type chunk data, for example, the pieces of the second type chunk data 1, 2, 3 and 4 in the dies through the one shot program method, as illustrated in FIG. 9.

FIG. 10 is a diagram illustrating a reading method of a data storage device according to an embodiment.

As data are distributed and stored in the plurality of dies, the read operation performance may also be improved.

The read operation of the unit data may include a data read-out operation from a memory cell and a read data transfer operation to a host device.

Referring to FIG. 10, the operations (1) to (12) which read unit data from the memory cells of the dies and the transfer operations (D.O) which transfer data to the host device may be performed in parallel and thus the read performance may be improved.

Figure 11:
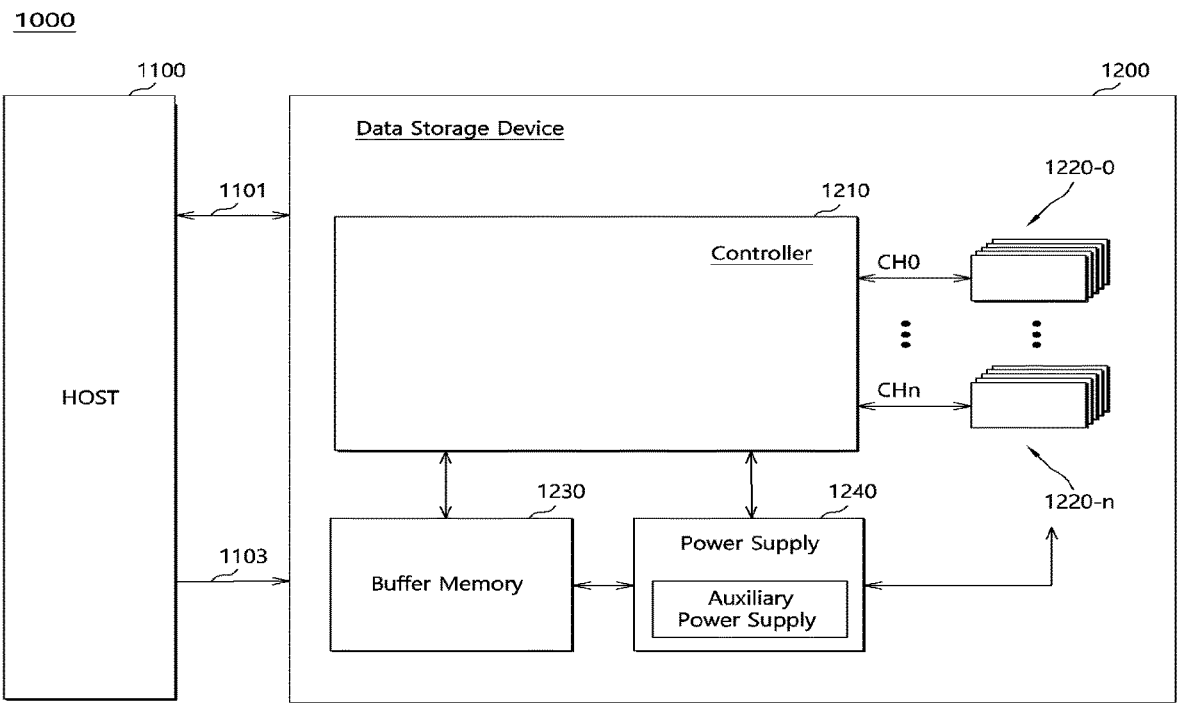
FIG. 11 is a diagram illustrating a data storage system in accordance with an embodiment of the present disclosure.

FIG. 11 is a diagram illustrating a data storage system in accordance with an embodiment.

Referring to FIG. 11, the data storage 1000 may include a host device 1100 and the data storage device 1200. In an embodiment, the data storage device 1200 may be configured as a solid state drive (SSD).

The data storage device 1200 may include a controller 1210, a plurality of nonvolatile memory devices 1220-0 to 1220-$n$, a buffer memory device 1230, a power supply 1240, a signal connector 1101, and a power connector 1103.

The controller 1210 may control general operations of the data storage device 1200. The controller 1210 may include a host interface, a control component, a random access memory used as a working memory, an error correction code (ECC) component, and a memory interface. In an embodiment, the controller 1210 may implemented by controller 110 as shown is FIG. 1 to FIG. 3.

The host device 1100 may exchange a signal with the data storage device 1200 through the signal connector 1101. The signal may include a command, an address, data, and other relevant information.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-$n$. Further, the buffer memory device 1230 may temporarily store the data read from at least one of the nonvolatile memory devices 1220-0 to 1220-$n$. The data temporarily stored in the buffer memory device 1230 may be transmitted to the host device 1100 or at least one of the nonvolatile memory devices 1220-0 to 1220-$n$ according to control of the controller 1210.

The nonvolatile memory devices 1220-0 to 1220-$n$ may be used as storage media of the data storage device 1200. The nonvolatile memory devices 1220-0 to 1220-$n$ may be coupled with the controller 1210 through a plurality of channels CH0 to CHn, respectively. One or more nonvolatile memory devices may be coupled to one channel. The nonvolatile memory devices coupled to each channel may be coupled to the same signal bus and data bus.

The power supply 1240 may provide power, inputted through the power connector 1103, to components of the data storage device 1200. The power supply 1240 may include an auxiliary power supply. The auxiliary power supply may supply power to allow the data storage device 1200 to be properly terminated when a sudden power-off occurs. The auxiliary power supply may include large capacity capacitors.

The signal connector 1101 may be configured by any of various types of connectors depending on an interface scheme between the host device 1100 and the data storage device 1200.

The power connector 1103 may be configured by any of various types of connectors depending on a power supply scheme of the host device 1100.

Figure 12:
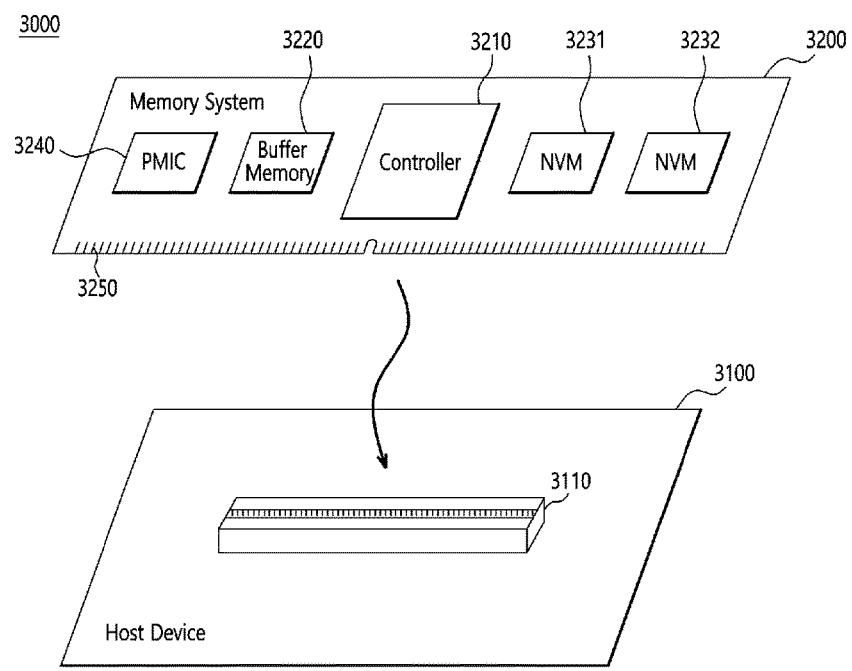
FIG. 12 and FIG. 13 are diagrams illustrating a data processing system in accordance with an embodiment of the present disclosure.

FIG. 12 is a diagram illustrating a data processing system in accordance with an embodiment. Referring to FIG. 12, the data processing system 3000 may include a host device 3100 and the memory system 3200.

The host device 3100 may be configured in the form of a board such as a printed circuit board. Although not shown, the host device 3100 may include internal function blocks for performing the function of a host device.

The host device 3100 may include a connection terminal 3110 such as a socket, a slot or a connector. The memory system 3200 may be mounted to the connection terminal 3110.

The memory system 3200 may be configured in the form of a board such as a printed circuit board. The memory system 3200 may be a memory module or a memory card.

The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 as shown in FIGS. 1 to 3.

The buffer memory device 3220 may temporarily store data to be stored in the nonvolatile memory devices 3231 and 3232. Further, the buffer memory device 3220 may temporarily store the data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power, inputted through the connection terminal 3250, to components of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, and data, as well as power may be transferred between the host device 3100 and the memory system 3200. The connection terminal 3250 may be configured as any of various types depending on an interface scheme between the host device 3100 and the memory system 3200. The connection terminal 3250 may be disposed on any side of the memory system 3200.

Figure 13:
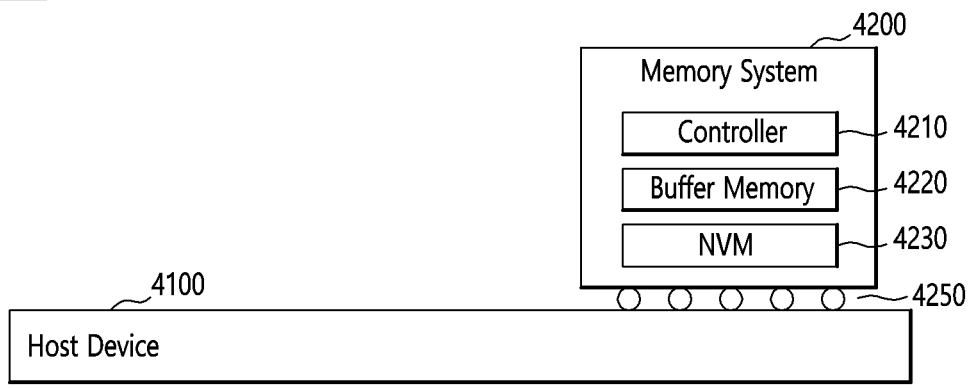

FIG. 13 is a diagram illustrating a data processing system in accordance with an embodiment. Referring to FIG. 13, the data processing system 4000 may include a host device 4100 and the memory system 4200.

The host device 4100 may be configured in the form of a board such as a printed circuit board. Although not shown, the host device 4100 may include internal function blocks for performing the function of a host device.

The memory system 4200 may be configured in the form of a surface-mounting type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 as shown in FIGS. 1 to 3.

The buffer memory device 4220 may temporarily store data to be stored in the nonvolatile memory device 4230. Further, the buffer memory device 4220 may temporarily store the data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 14:
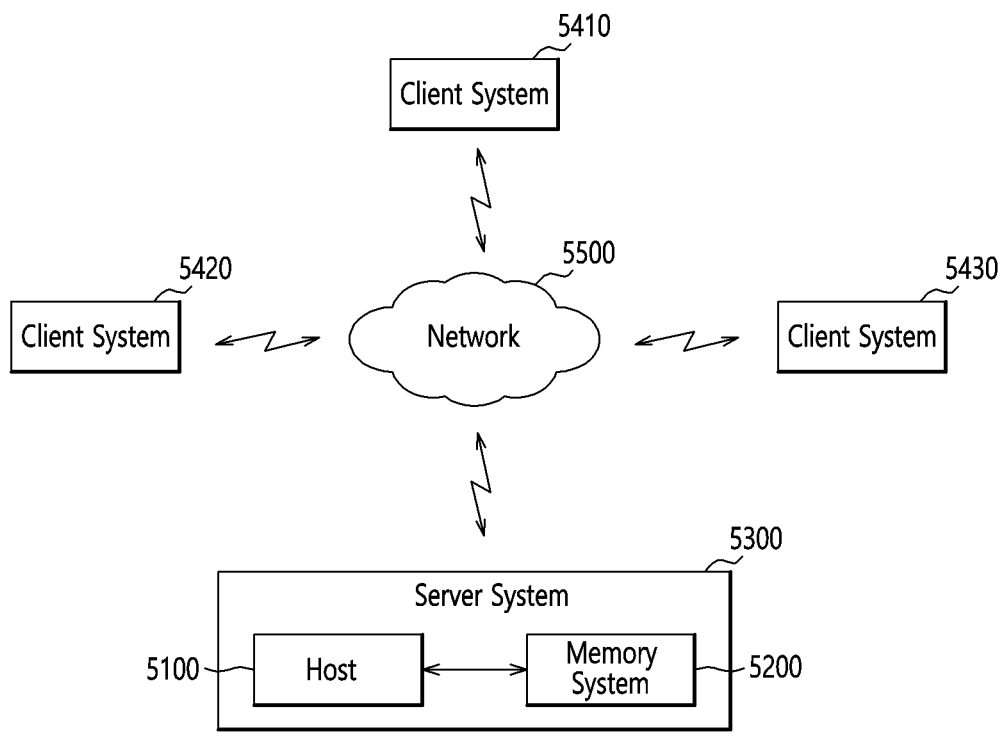
FIG. 14 is a diagram illustrating a network system including a data storage device in accordance with an embodiment of the present disclosure.

FIG. 14 is a diagram illustrating a network system including a data storage device in accordance with an embodiment. Referring to FIG. 14, the network system 5000 may include a server system 5300 and a plurality of client systems 5410 to 5430 which are coupled through a network 5500.

The server system 5300 may service data in response to requests from the plurality of client systems 5410 to 5430. For example, the server system 5300 may store the data provided from the plurality of client systems 5410 to 5430. For another example, the server system 5300 may provide data to the plurality of client systems 5410 to 5430.

The server system 5300 may include a host device 5100 and the memory system 5200. The memory system 5200 may be implemented by the memory system 10 shown in FIG. 1, the data storage device 1200 shown in FIG. 11, the memory system 3200 shown in FIG. 12 or the memory system 4200 shown in FIG. 13.

Figure 15:
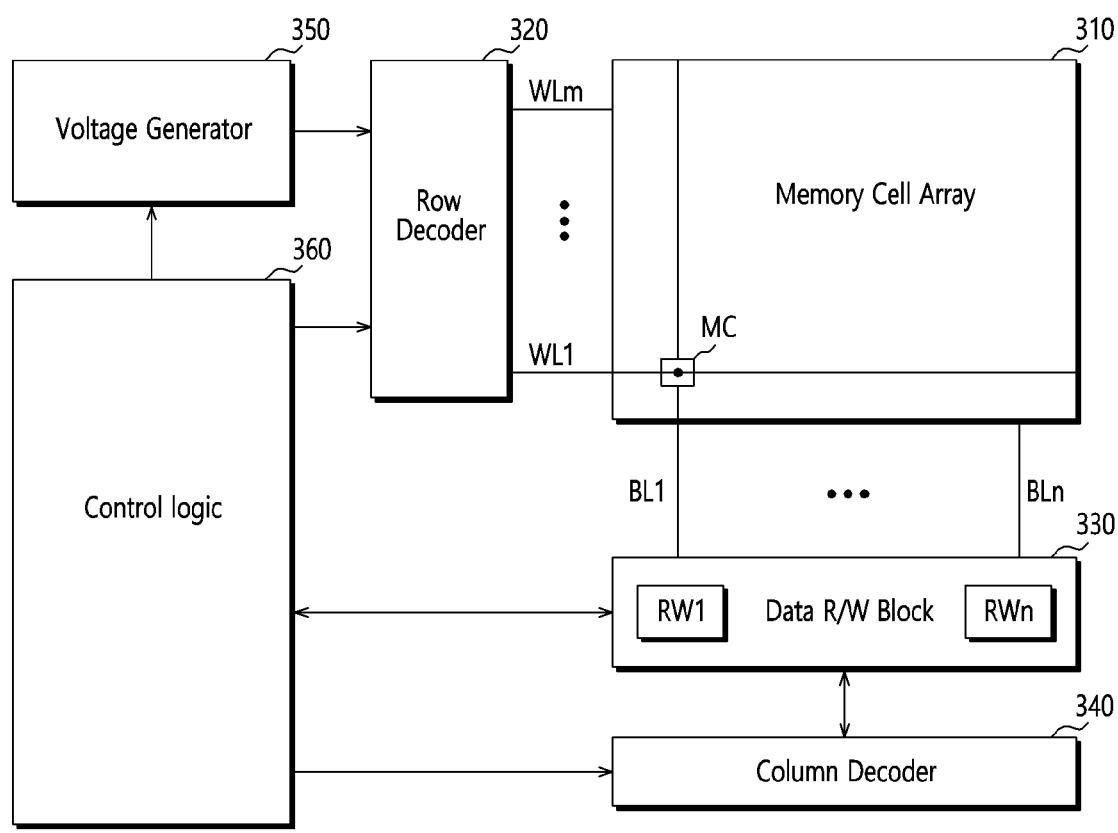
FIG. 15 is a block diagram illustrating a nonvolatile memory device included in a data storage device in accordance with an embodiment of the present disclosure.

FIG. 15 is a block diagram illustrating a nonvolatile memory device included in a data storage device in accordance with an embodiment. Referring to FIG. 15, the nonvolatile memory device 300 may include a memory cell array 310, a row decoder 320, a data read/write block 330, a column decoder 340, a voltage generator 350, and control logic 360.

The memory cell array 310 may include memory cells MC which are arranged at areas where word lines WL1 to WLm and bit lines BL1 to BLn intersect with each other.

The memory cell array 310 may comprise a three-dimensional memory array extending along the flat surface of a semiconductor substrate as well as vertically with respect to that surface. That is, in the NAND strings of the three-dimensional memory array memory cells are arranged in the horizontal and vertical directions with respect to the surface of the semiconductor substrate. The memory cells may be variously spaced to provide different degrees of integration.

The structure of the three-dimensional memory array is not limited thereto. The dimensions of the three-dimensional memory array need not be with respect to the surface of the semiconductor substrate.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been illustrated and described above, it will be understood by those skilled in the art in light of the present disclosure that the embodiments described are examples only. Accordingly, the present invention is not limited based on the described embodiments.

The above described embodiments of the present invention are intended to illustrate and not to limit the present invention. Various alternatives and equivalents are possible. The invention is not limited by the embodiments described herein. Nor is the invention limited to any specific type of semiconductor device. Various additions, subtractions, or modifications will be apparent in view of the present disclosure and all are encompassed by the present invention to the extent they fall within the scope of the appended claims.

What is claimed is:

1. A data storage device comprising:
a storage including a nonvolatile buffer and a nonvolatile user data storage region;
a volatile buffer configured to temporarily store data to be stored in the storage; and
a controller configured to generate second type chunk data by combining a first unit data of first type chunk data temporarily stored in the nonvolatile buffer and a second unit data of first type chunk data temporarily stored in the volatile buffer and is not transferred to the nonvolatile buffer and store the second type chunk data in the nonvolatile user data storage region.

2. The data storage device of claim 1, wherein the controller is configured to write the second type chunk data in the nonvolatile user data storage region through a one-shot program method.

3. The data storage device of claim 1, wherein a memory cell constituting the nonvolatile buffer is set to store 1-bit data and a memory cell constituting the nonvolatile user data storage region is set to store multi-bit data.

4. An operating method of a data storage device which includes a storage including a first memory region and a second memory region, a buffer memory, and a controller configured to control data to be stored in the storage, the method comprising,
writing, by the controller, first type chunk data, which is configured of plural pieces of unit data, in the first memory region from the buffer memory;
generating, by the controller, at least one segment of second type chunk data by combining at least one piece of unit data constituting a first segment of the first type chunk data and at least one piece of unit data constituting a second segment of the first type chunk data, which is introduced into the buffer memory after the first segment of the first type chunk data and is not transferred to the first memory region; and
writing, by the controller, the at least one segment of the second type chunk data in the second memory region.

5. The method of claim 4,
wherein the storage includes a plurality of dies, and each of the plurality of dies includes the first memory region and the second memory region, and
wherein the writing in the first memory region includes distributing and storing the plural pieces of unit data constituting the first segments of the first type chunk data in the first memory regions of the plurality of dies.

6. The method of claim 4,
wherein the storage includes a plurality of dies, and each of the plurality of dies includes the first memory region and the second memory region, and
wherein the writing in the second memory region includes distributing and storing the at least one segment of the second type chunk data in the second memory regions of the plurality of dies.

7. The method of claim 4,
wherein the storage includes a plurality of dies, and each of the plurality of dies includes the first memory region and the second memory region, and
wherein the number of plural pieces of unit data constituting the first segment of the first type chunk data is the same as the number of the plurality of dies.

8. The method of claim 4,
wherein the storage includes a page buffer, and
wherein the writing in the second memory region includes transferring the at least one segment of the second type chunk data to the second memory region via the page buffer.

9. The method of claim 4, wherein the writing in the second memory region includes writing the at least one segment of the second type chunk data in the second memory region through a one-shot program method.

10. The method of claim 4, wherein a memory cell constituting the first memory region is set to store 1-bit data and a memory cell constituting the second memory region is set to store multi-bit data.

11. A data storage device comprising:
a storage including a first memory region and a second memory region;
a buffer memory configured to temporarily store data to be stored in the storage; and
a controller configured to control the data to be stored in the storage,
wherein the controller includes:
a prewrite circuit configured to write first type chunk data, which is configured of plural pieces of unit data, in the first memory region from the buffer memory;
a combination circuit configured to generate at least one segment of second type chunk data by combining at least one piece of unit data constituting a first segment of the first type chunk data written in the first memory region by the prewrite circuit and at least one piece of unit data constituting a second segment of the first type chunk data, in which the second segment of the first type chunk data is introduced into the buffer memory after the first segment of the first type chunk data and is not transferred to the first memory region; and
a main write circuit configured to write the at least one segment of the second type chunk data generated by the combination circuit in the second memory region.

12. The data storage device of claim 11, wherein the storage includes a plurality of dies, and each of the plurality of dies is configured to include the first memory region and the second memory region.

13. The data storage device of claim 12, wherein the prewrite circuit is configured to distribute and store the plural pieces of unit data constituting the first segments of the first type chunk data in the first memory region of the plurality of dies.

14. The data storage device of claim 12, wherein the main write circuit is configured to distribute and store the at least one segment of the second type chunk data in the second memory region of the plurality of dies.

15. The data storage device of claim 12, wherein the number of the plural pieces of unit data constituting the first segment of the first type chunk data is the same as the number of the plurality of dies.

16. The data storage device of claim 12,
wherein the first segment of the first type chunk data includes first to fourth pieces of unit data,
wherein the second segment of the first type chunk data includes fifth to eighth pieces of unit data,
wherein the plurality of dies include first to fourth dies,
wherein the prewrite circuit is configured to distribute and store the first segment of the first type chunk data in the first memory regions of the first to fourth dies and distribute and store the second segment of the first type chunk data in the first memory regions of the first to fourth dies, and
wherein the combination circuit is configured to, as a third segment of the first type chunk data including ninth to twelfth unit data is introduced into the buffer memory, generate at least one segment of the second type chunk data by selecting one unit data from each of the first to third segments of the first type chunk data, respectively.

17. The data storage device of claim 11,
wherein the storage includes a page buffer, and
wherein the main write circuit is configured to transfer the at least one segment of the second type chunk data to the second memory region via the page buffer.

18. The data storage device of claim 11, wherein the main write circuit is configured to write the at least one segment of the second type chunk data in the second memory region through a one-shot program method.

19. The data storage device of claim 11, wherein the storage is set to store 1-bit data in a memory cell constituting the first memory region and to store multi-bit data in a memory cell constituting the second memory region.

* * * * *